United States Patent [19]
Ohshita et al.

[11] Patent Number: 5,515,985
[45] Date of Patent: May 14, 1996

[54] METHOD OF FORMING FINE COPPER CONDUCTOR PATTERN

[75] Inventors: Yoshio Ohshita; Nobuki Hosoi, both of Tokyo, Japan

[73] Assignee: NEC Corporation, Tokyo, Japan

[21] Appl. No.: 261,220

[22] Filed: Jun. 15, 1994

[30] Foreign Application Priority Data

Jun. 24, 1993 [JP] Japan ..................... 5-175932

[51] Int. Cl.⁶ ........................................ H05H 1/00
[52] U.S. Cl. ................... 216/66; 216/78; 216/67; 156/643.1; 156/646.1; 156/656.1
[58] Field of Search .................... 156/643.1, 646.1, 156/656.1; 216/66, 78, 67

[56] References Cited

U.S. PATENT DOCUMENTS

| | | | |
|---|---|---|---|
| 4,693,779 | 9/1987 | Okuhira et al. | 156/666 X |
| 4,891,488 | 1/1990 | Davis et al. | 156/345 X |
| 5,183,531 | 2/1993 | Terakado | 156/643 |
| 5,246,529 | 9/1993 | Fukasawa et al. | 156/643 |
| 5,344,525 | 9/1994 | Cathey, Jr. | 156/643 |

*Primary Examiner*—Thi Dang
*Attorney, Agent, or Firm*—Young & Thompson

[57] ABSTRACT

In a method of forming a fine copper conductor pattern by dry etching, radiation having a predetermined wavelength or greater is applied to the surface of a substrate in order to accelerate the desorption of a compound which is formed of an etching gas and copper in the surface of a copper layer. The fine copper conductor pattern is anisotropically formed based on the linearity of the applied radiation and ions.

3 Claims, 3 Drawing Sheets

METHOD OF FORMING FINE COPPER CONDUCTOR PATTERN

BACKGROUND OF THE INVENTION

1. Field of the Invention

The present invention relates to a method of forming a fine copper conductor pattern in an LSI (large scale integration) circuit, and more particularly to a method of forming a finer copper conductor pattern by a dry etching process which employs a gas containing chlorine.

2. Description of the Prior Art

It has heretofore been customary to employ circuit conductors or interconnections of aluminum in LSI circuits. As LSI circuit conductors or interconnections become finer and finer, however, the aluminum is less resistant to stress migration and electromigration, posing a problem as to the reliability of semiconductor devices. Another matter of concern is that as semiconductor devices operate at higher speeds, the processing speed of a semiconductor device is governed by the delay caused by circuit conductors or interconnections. It is therefore necessary to use circuit conductors or interconnections of a material having a lower electric resistance in order to realize higher-speed semiconductor devices.

To meet the above demands, an attempt has been made to use copper as a conductor or interconnection material for further semiconductor devices. However, it is difficult to form fine conductor patterns of copper for LSI circuits using the presently available dry etching process for forming fine conductor patterns of aluminum, and hence the present dry etching process entails drawbacks with respect to the formation of fine copper interconnections. The reasons why the present dry etching process cannot be used to produce fine copper conductors are as follows: In the normal dry etching process, a halogen decomposed by a plasma is adsorbed to the surface of a substrate to be etched, forming molecules that can easily be desorbed from the substrate surface. When subjected to ion impact, these molecules are desorbed from the substrate surface, thus etching the substrate. At this time, since the ions are applied perpendicularly to the substrate, the etching process is anisotropic in that side walls on the substrate are not etched. When a copper substrate is etched by the normal drying etching process, however, no etching progresses because a copper halide is not desorbed from the surface of the copper substrate. This is because the equilibrium vapor pressure of the copper halide is much lower than that of aluminum, and almost no ion-assisted effect occurs. As a result, when the substrate is exposed to a $Cl_2$ plasma at about room temperature, only a layer of $CuCl_2$ is formed on the copper surface, and no etching occurs. One solution has been to heat the copper substrate to 250° C. or higher to accelerate desorption of the copper halide to etch the copper surface.

The above conventional process of forming fine copper conductors is not compatible with the dry etching process because the photoresist which is presently used mainly to form aluminum conductors or interconnections cannot be used as a mask for the reason that the photoresist would be hardened due to the high temperature of the substrate in etching the copper surface. Since the substrate temperature is high, chlorine is easily thermally diffused into copper conductors which are being etched, with the result that many chlorine molecules are present on the surface of the film and within the film after the etching process is finished. These chlorine molecules on the surface of the film and within the film react with moisture in the air, corroding the copper conductors and lowering the reliability of the semiconductor device.

When the present dry etching process is employed to form fine copper conductors, the etching reaction progresses primarily thermally, rather than being ion-assisted. Specifically, molecules produced on the copper surface during etching are desorbed by procuring thermal energy from the substrate. In the case where there is an ion-assisted effect available for desorption of adsorbed molecules by collision with ions, etching progresses in regions where the ions are applied, and no etching reaction takes place in other regions. Accordingly, it is possible to form fine conductor patterns with an anisotropic property which is produced by the linearity of applied ions. In the dry etching of copper where molecules are desorbed principally by the thermal energy from the substrate, etching progresses also on side walls. Consequently, an isotropically etched configuration is produced, and it is difficult to obtain an anisotropic property that is required to form fine conductor or interconnection patterns by dry etching of copper.

SUMMARY OF THE INVENTION

It is an object of the present invention to provide a method of forming a fine copper conductor pattern with an anisotropic etching process at low temperature.

To accomplish the above object, there is provided in accordance with the present invention a method of forming a fine copper conductor pattern by dry etching, comprising the steps of placing a substrate in a chamber, the substrate having a copper film, introducing an etching gas into the chamber, maintaining a predetermined pressure in the chamber, applying to a surface of the substrate radiation having a wavelength which can be absorbed by a compound which is formed of the etching gas and copper of the copper film in a surface of the copper film during dry etching of the copper film, and generating a plasma in the chamber to start the dry etching of the copper film.

It has been difficult to form a fine copper conductor pattern with the conventional dry etching process because the vapor pressure of a copper halide is low. When the desorption of the copper halide is accelerated by heating the substrate, the above problem occurs, making it difficult to form a fine copper conductor pattern. To form a fine copper conductor pattern, it is necessary to impart an energy other than the thermal energy to an etching product (adsorbed molecules) to promote its desorption. According to the present invention, optical excitation is employed to accelerate the desorption of the etching product. When, for example, $Cl_2$ is supplied to the surface of a copper film, a layer of $CuCl_2$ is formed on the surface of the copper film. The etching rate is determined by the speed of desorption from the surface of the $CuCl_2$ layer. Molecules of $CuCl_2$ effectively absorb a radiation whose wavelength is longer than 700 nm, and particularly in the range of from 800 to 900 nm. When such radiation is absorbed, the electrons in the 3d orbit of Cu, which greatly contribute to the formation of a stable bond between the $CuCl_2$ molecules and the surface, are excited. As a result, in unmasked surface areas to which the radiation is applied, the absorbed species is excited and can easily be desorbed, with the result that the copper film can be etched at a temperature lower than with the conventional dry etching process. Inasmuch as the radiation and ions are linear, the etched configuration is rendered anisotropic.

To facilitate the desorption of the absorbed molecules, it is necessary to increase the intensity of the applied radiation. Part of the applied radiation is turned into thermal energy, which heats the substrate. For efficiently utilizing the effect of the applied radiation, it is necessary to cool the substrate. In the case where sufficient radiation intensity is not available due to apparatus limitations, it is necessary to heat the substrate to make up for a shortage of the effect of the optical excitation. Therefore, it is preferable to control the temperature of the substrate in addition to the application of the radiation in order to form a fine copper conductor pattern with good controllability.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
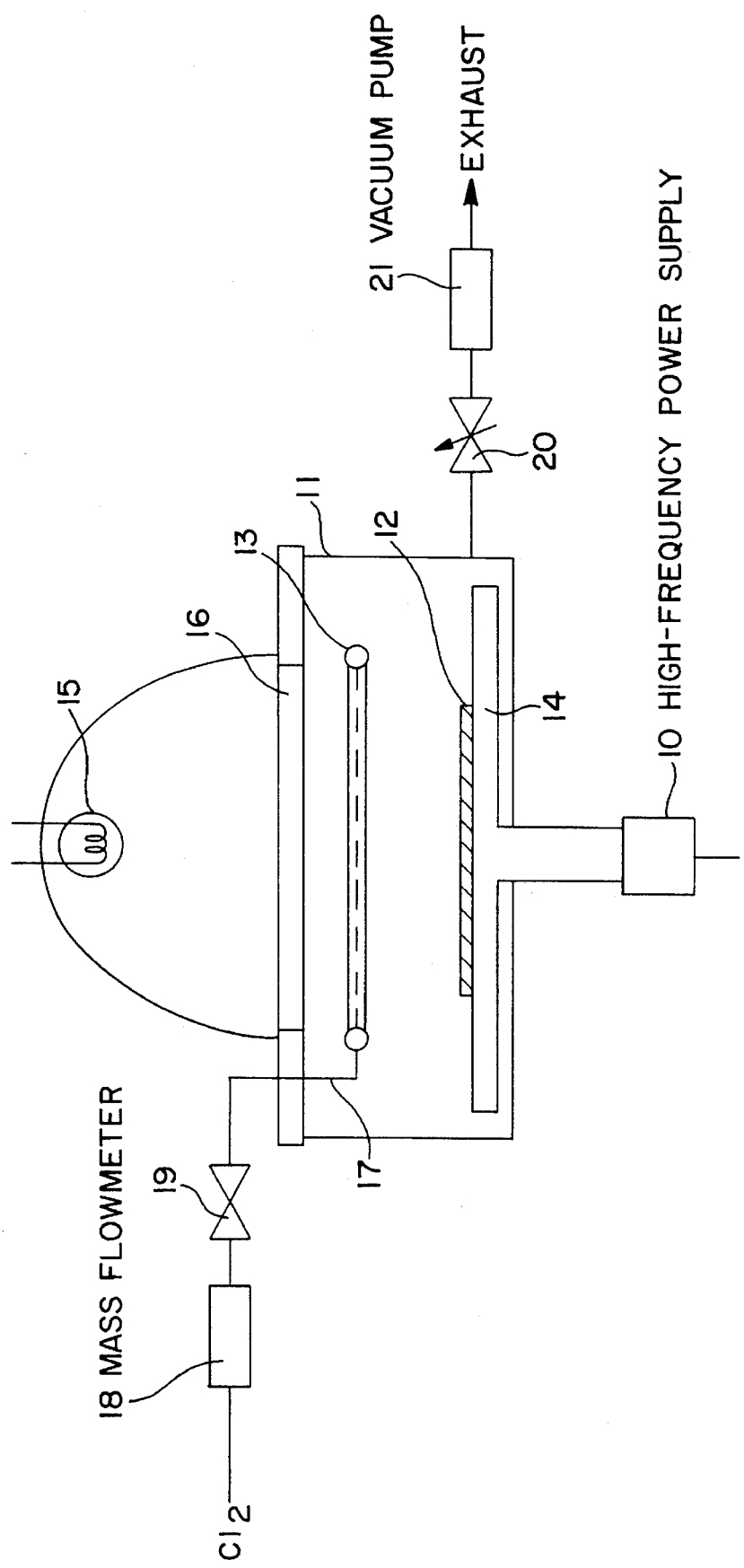
FIG. 1 is a schematic view of an apparatus for carrying out a method of forming a fine copper conductor pattern according to a first embodiment of the present invention.

As shown in FIG. 1, an apparatus for carrying out a method of forming a fine copper conductor pattern according to a first embodiment of the present invention is in the form of a parallel-plate RIE (reactive ion etching) apparatus. The apparatus comprises a chamber 11 for holding a substrate 12 therein, the chamber 11 capable of being evacuated by a vacuum pump 21, a high-frequency power supply 10 and upper and lower electrodes 13, 14 for producing a plasma in the chamber 11, a gas inlet port 17 for introducing an etching gas into the chamber 11, and an infrared lamp 15 for applying infrared radiation to the substrate 12 in the chamber 11 through a quartz window 16. To the gas inlet port 17, there are connected a mass flowmeter 18 and a valve 19 for controlling the supply and stoppage of the etching gas. The pressure of the etching gas introduced from the gas inlet port 17 into the chamber 11 is maintained at a constant level by a pressure-regulating variable valve 20 coupled to the vacuum pump 21.

Figure 2:
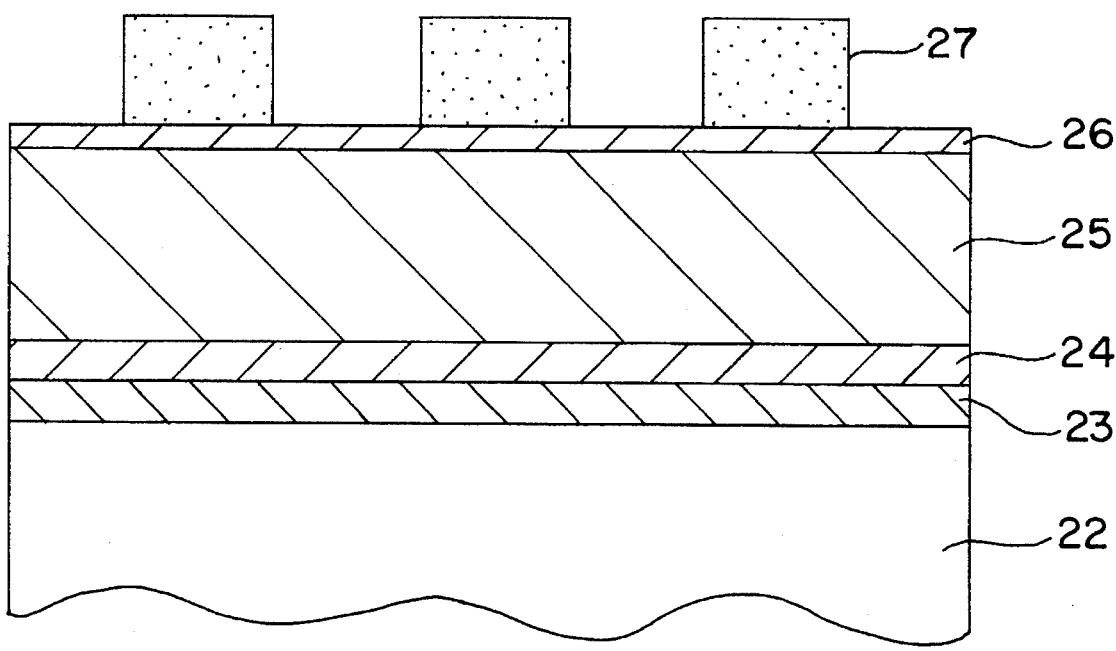
FIG. 2 is a cross-sectional view of a substrate structure used in the method according to the first embodiment.

FIG. 2 shows in cross section a substrate structure which is produced by processing the substrate 12 to form a fine copper conductor pattern. As shown in FIG. 2, a silicon oxide film 23 having a thickness of 100 nm is formed as a base layer by thermal oxidization on a silicon substrate 22 which corresponds to the substrate 12 shown in FIG. 1. It has been reported that copper can easily be diffused into a silicon oxide film, deteriorating the characteristics of semiconductor devices. Therefore, a TiN layer 24 is deposited as a barrier metal to a thickness of 100 nm on the silicon oxide film 23 by sputtering. Thereafter, a copper film 25 is deposited as a conductor material to a thickness of 500 nm on the TiN layer 24. In order to increase adhesion to a mask and also to prevent the copper film 25 from being corroded, a TiN layer 26 is deposited to a thickness of 50 nm on the copper film 25 by sputtering, and a silicon oxide film 27 is then deposited as a hard mask to a thickness of 300 nm on the TiN layer 26 by CVD (chemical vapor deposition). Thereafter, a photoresist is spin-coated on the silicon oxide film 27, exposed, and etched to form a conductor pattern having a minimum conductor width of 0.45 micron. Subsequently, using a photoresist as a mask, the silicon oxide film 27 is removed by dry etching, thereby forming a hard mask having the above conductor pattern.

Operation of the apparatus shown in FIG. 1 as the method of forming a fine copper conductor pattern will next be described.

The substrate 12 is placed in the chamber 11, and the chamber 11 is evacuated by the vacuum pump 20. Thereafter, $Cl_2$ gas, for example, is introduced into the chamber 11 through the gas inlet port 17. The pressure-regulating variable valve 20 and the vacuum pump 21 are actuated to keep the pressure in the chamber 11 at about 3 Pa. The infrared lamp 15 is energized to apply infrared radiation to the surface of the substrate 12 through the quartz window 16. The high-frequency power supply 10 is turned on to produce a $Cl_2$ plasma between the electrodes 13, 14, thereby starting to etch the substrate 12. At this time, the surface of the substrate 12 is kept at a temperature of 150° C. After the substrate 12 has been etched for about 2 minutes, the high-frequency power supply 10 is turned off, the infrared lamp 15 is de-energized, and the supply of the $Cl_2$ gas is stopped. After the temperature of the substrate 12 has dropped to room temperature, the substrate 12 is taken out of the chamber 11 for evaluation of its configuration, etc.

A study of the embodiment indicates that the copper below the hard mask was not etched, while other areas were removed by anisotropy. As a result, fine copper conductors each having a width of 0.45 micron were formed on the substrate 12. The minimum conductor width of 0.45 micron referred to above is determined by the dimensions of the hard mask. When a hard mask having a smaller conductor width is used, finer copper conductors can be produced.

The formed fine copper conductors were held in the atmosphere for about 24 hours, but no conductor corrosion occurred. This is because the amount of chlorine diffused in the copper film during the etching process was low as the copper was processed at a low temperature.

In the above embodiment, the infrared lamp is employed as a light source. However, any of various other light sources may be used insofar as the emitted light has a wavelength which can be absorbed by $CuCl_2$ produced in the copper surface during the etching process. For example, another lamp for emitting light having such a wavelength may be employed, or light having such a wavelength may be produced by passing white light through a bandpass filter.

Figure 3:
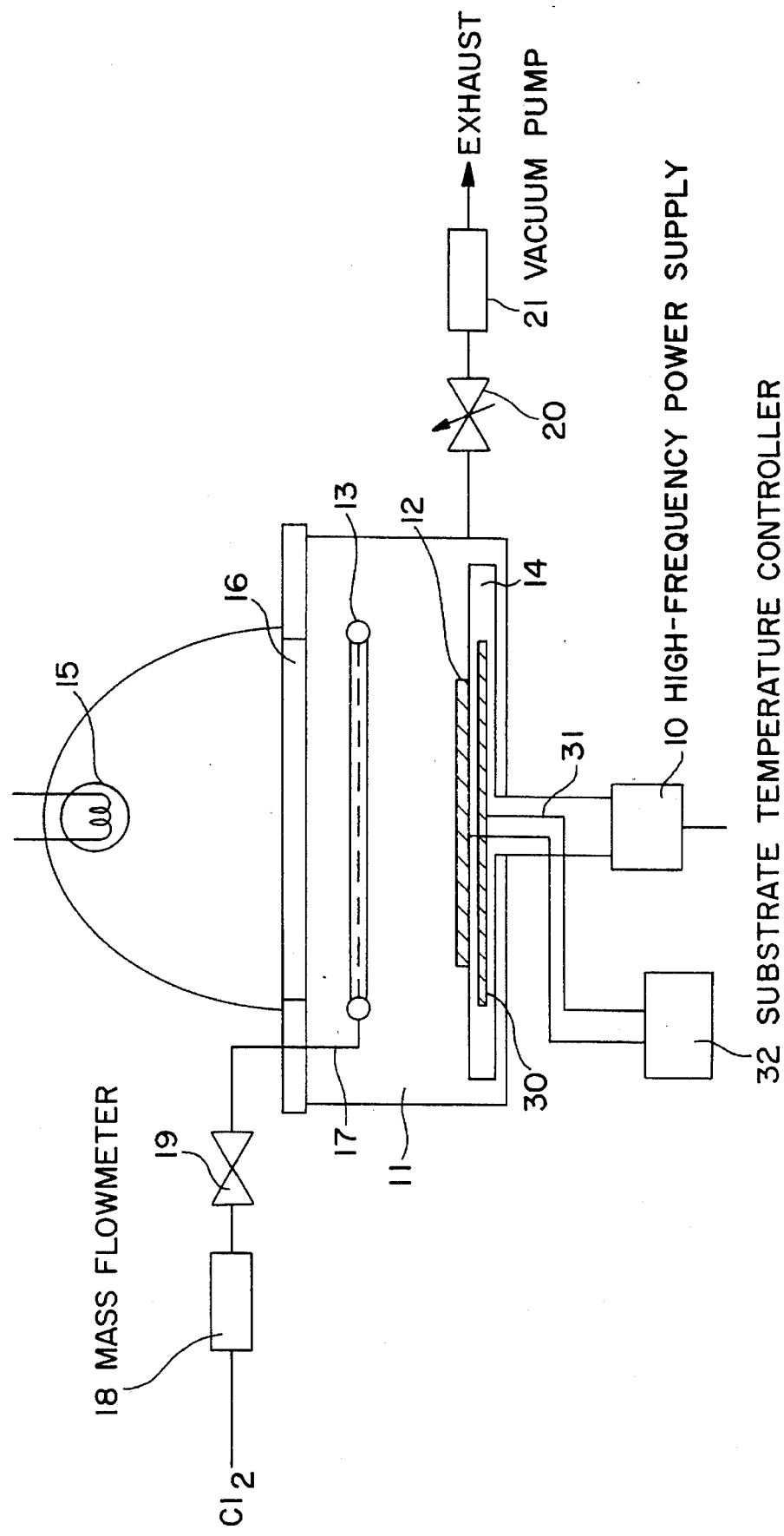
FIG. 3 is a schematic view of an apparatus for carrying out a method of forming a fine copper conductor pattern according to a second embodiment of the present invention.

FIG. 3 shows an apparatus for carrying out a method of forming a fine copper conductor pattern according to a second embodiment of the present invention. The apparatus shown in FIG. 3 is basically the same as the apparatus shown in FIG. 1 except that the lower electrode 14 has a substrate heating/cooling mechanism 30 for varying the temperature of the substrate 12. The substrate heating/cooling mechanism 30 is electrically connected through a thermocouple 31 to a substrate temperature controller 32 for controlling the temperature of the substrate 12.

The substrate heating/cooling mechanism 30 cools the substrate 12 to 150° under conditions in which the substrate 12 would be heated to 250° C. by the application of the infrared radiation if the temperature of the substrate 12 were not controlled. The other etching conditions and steps are the same as those of the first embodiment. As a result, the etching rate is about 1.5 times higher than the method according to the first embodiment where the intensity of the applied infrared radiation is lower.

While the substrate 12 is cooled in the second embodiment, if sufficient infrared radiation intensity is not available due to apparatus limitations, the same advantage can be attained by heating the substrate 12 within a range allowed by the process.

By the principles of the present invention, the desorption of an etching product, which would not be desorbed at temperatures lower than 250° C. according to the conventional etching process, is accelerated, and hence the substrate can be etched at temperatures lower than with the conventional etching process. It is possible to process the copper film with such an anisotropic property that masked areas of copper are not etched but exposed areas of copper are etched, based on the anisotropy of the infrared radiation and ions. Consequently, fine copper conductor patterns each having a conductor width of 1 micron or less can be formed at low temperature with sufficient anisotropy. Furthermore, fine copper conductor patterns can be processed with better controllability by controlling the substrate temperature simultaneously with the application of the infrared radiation.

While preferred embodiments of the invention have been described using specific terms, such description is for illustrative purpose only, and it is to be understood that changes and variations may be made without departing from the spirit of the following claims.

What is claimed is:

1. A method of forming a fine copper conductor pattern by dry etching with the use of light irradiation and a plasma, comprising the steps of:

placing a substrate in a chamber, said substrate having a copper film;

introducing an etching gas into said chamber;

maintaining a pressure in said chamber;

applying to a surface of said substrate light irradiation having a wavelength of at least 700 nm which can be absorbed by a compound which is formed of said etching gas and copper of said copper film on a surface of the copper film during dry etching of the copper film to cause electronic excitation in said compound, thereby weakening bonding strength between said compound and said surface; and generating a plasma in said chamber to start the dry etching of the copper film.

2. A method according to claim 1 wherein said etching gas comprises a gas containing chlorine.

3. A method according to claim 1 further comprising the step of cooling the substrate to a temperature at which no etching progresses on walls of copper conductors.

* * * * *